（12） United States Patent
Capelli et al.

(10) Patent No.: US 8,772,765 B2
(45) Date of Patent: Jul. 8, 2014

(54) ELECTROLUMINESCENT ORGANIC TRANSISTOR

(75) Inventors: Raffaella Capelli, Bologna (IT); Michele Muccini, Bologna (IT)

(73) Assignee: E.T.C. S.R.L., Bologna (BO) (IT)

( * ) Notice: Subject to any disclaimer, the term of this patent is extended or adjusted under 35 U.S.C. 154(b) by 0 days.

(21) Appl. No.: 13/810,441

(22) PCT Filed: Jul. 26, 2012

(86) PCT No.: PCT/IB2012/053815
§ 371 (c)(1),
(2), (4) Date: Jan. 15, 2013

(87) PCT Pub. No.: WO2013/018000
PCT Pub. Date: Feb. 7, 2013

(65) Prior Publication Data
US 2013/0175518 A1    Jul. 11, 2013

(30) Foreign Application Priority Data
Jul. 29, 2011    (IT) ............................... MI2011A1447

(51) Int. Cl.
*H01L 51/50*    (2006.01)
*H01L 51/05*    (2006.01)

(52) U.S. Cl.
CPC ................. *H01L 51/5012* (2013.01); *H01L 51/0545* (2013.01)
USPC ...................................................... 257/40

(58) Field of Classification Search
CPC ............ H01L 51/0545; H01L 51/5012
USPC ..................................... 257/40, 59–72
See application file for complete search history.

(56) References Cited

U.S. PATENT DOCUMENTS

| 6,720,572 B1 | 4/2004 | Jackson et al. | |
|---|---|---|---|
| 7,829,884 B2 | 11/2010 | Gelinck et al. | |
| 7,868,319 B2 | 1/2011 | Adachi et al. | |
| 7,960,724 B2* | 6/2011 | Noh et al. | 257/40 |
| 8,237,157 B2* | 8/2012 | Liao et al. | 257/40 |
| 8,513,654 B2* | 8/2013 | Saito et al. | 257/40 |
| 8,618,532 B2* | 12/2013 | Sekiya et al. | 257/40 |

(Continued)

FOREIGN PATENT DOCUMENTS

| EP | 1367659 A2 | 12/2003 |
|---|---|---|
| JP | 2003100457 | 4/2003 |
| WO | 2009/099205 | 8/2009 |
| WO | 2010/049871 | 5/2010 |

OTHER PUBLICATIONS

PCT International Searching Report, Application PCT/IB2012/053815, filed Jul. 26, 2012 in the name E.T.C. S.r.l. Date of mailing: Dec. 10, 2012.

(Continued)

*Primary Examiner* — Cuong Q Nguyen
(74) *Attorney, Agent, or Firm* — Steinfl & Bruno LLP

(57) ABSTRACT

An electroluminescent organic transistor is described. The electroluminescent organic transistor has a semiconductor heterostructure constituted by a plurality of layers of semiconductor materials of p-type and n-type, which act, respectively, for the conduction of holes and electrons within the heterostructure, and at least two layers of emitting materials each of which is interposed between, and in direct contact with, one of the layers of p-type semiconductor material and another one of the layers of n-type semiconductor material.

7 Claims, 2 Drawing Sheets

(56) References Cited

U.S. PATENT DOCUMENTS

| | | |
|---|---|---|
| 2006/0188745 A1 | 8/2006 | Liao et al. |
| 2007/0252137 A1 | 11/2007 | Gelinck et al. |
| 2008/0116450 A1 | 5/2008 | Fong et al. |
| 2009/0212281 A1 | 8/2009 | Adachi et al. |
| 2010/0283063 A1 | 11/2010 | Imai |
| 2011/0215314 A1 | 9/2011 | De Leeuw et al. |

OTHER PUBLICATIONS

PCT Written Opinion of the International Searching Authority, Application PCT/IB2012/053815, filed Jul. 26, 2012 in the name E.T.C. S.r.l. Date of mailing: Dec. 10, 2012.

Wei, Bin, et al. "Integrating organic light-emitting diode and field-effect-transistor in a single device." Organic Electronics 9.3 (2008): 323-327.

Capelli, Raffaella, et al. "Organic light-emitting transistors with an efficiency that outperforms the equivalent light-emitting diodes." (2010).

1-Non-Final Office Action mailed on Oct. 17, 2013 for U.S. Appl. No. 13/806,898 filed on Dec. 26, 2012 in the name of Michele Muccini et al.

2-Notice of Allowance mailed on May 6, 2014 for U.S. Appl. No. 13/806,898 filed on Dec. 26, 2012 in the name of Michele Muccini et al.

3-PCT International Search Report mailed on Dec. 10, 2012 for PCT/IB2012/053817 filed on Jul. 26, 2012 in the name of E.T.C. S.P.A.

4-PCT Written Opinion mailed on Dec. 10, 2012 for PCT/IB2012/053817 filed on Jul. 26, 2012 in the name of E.T.C. S.P.A.

5-Huang-T. et al. Materials for High Performance Single-Layer OLED Devices, Significant Research Achievements of Academia Sinica, pp. 13-16 (2007).

6-Dodabalapur, A. et al. Molecular Orbital Energy level Engineering in Organic Transistors. Advanced Materials, vol. 8, pp. 853-855 (1996).

* cited by examiner

ELECTROLUMINESCENT ORGANIC TRANSISTOR

CROSS REFERENCE TO RELATED APPLICATIONS

The present application is the US national stage of International Application PCT/IB2012/053815 filed on Jul. 26, 2012 which, in turn, claims priority to Italian Application MI2011A001447 filed on Jul. 29, 2011.

The present invention relates to an electroluminescent organic transistor (known in the field with the acronym OLET: Organic Light-Emitting Transistor).

There has been in recent years a growing interest for the use of heterostructures formed of two or more materials in the field of organic transistors engineering. The scientific publication in the name of Dodabalapur et al. with the title "Molecular orbital energy level engineering in organic transistors" published in 1996 on Advanced Materials, Volume 8 pages 853-855, shows the possibility of bipolar behavior of structures consisting of an organic p-type semiconductor, i.e. capable of carry holes, coated with an organic n-type semiconductor, i.e. capable of transporting electrons. These structures are usually defined as p-n heterostructures. In the publication, however, it is only assumed the possibility of exploiting said behavior for the development of light-emitting devices, without addressing the specific technical problems of this application and without identifying the structural and compositional characteristics of the most suitable heterostructures for this purpose.

It is known, from patent application US2008/0116450, an electroluminescent device comprising a first electrode, a second electrode and a semiconductor structure comprising two layers of semiconductor material having a higher charge mobility and a layer of semiconductor material with a lower charge mobility disposed between the first two layers. The use of this type of structure is described as sufficient to increase the charge transport compared to a simple p-n type heterostructure, with a consequent increase of the recombination process rate and thus an improvement of the efficiency of the device. Anyway, this patent application also indirectly poses the problem of increasing the luminous efficiency of the device and describes an electroluminescent device comprising three semiconductor structures stacked one above the other with interposed electrodes. However, a device with a diode layered structure with interposed electrodes has considerable problems of technical feasibility connected with the limits of the thickness of the organic layers.

The scientific publication of Wei et al. with the title "Integrating organic light-emitting diode and field-effect transistor in a single device" published in Organic Electronics in 2008, volume 9 pages 323-327, teaches the use of an OLED with a FET structure to control and manipulate the charge carriers reaching the emissive layer of the OLED stack with the aim to avoid the use of an OLET structure and therefore overcome the edge emission and light quenching near metal drain electrode that occur in some OLET structures. Anyway the device described by Wei et al. does not allow for an effective drive circuit simplification as consequence of the use of an OLED as emitting structure.

The scientific publication of Capelli et al. with the title "Organic light-emitting transistors with an efficiency that outperforms the equivalent light-emitting diodes" published in Nature Materials in 2010, volume 9 pages 496-503, discloses the use of three-layers heterostructures in OLET devices, characterized by the presence of one layer of emitting material r (that is, having light emitting properties due to charge recombination processes) positioned between a p-type semiconductor layer and an n-type semiconductor layer. Although this architecture has shown a significant improvement in terms of luminous efficiency compared to the architectures of the prior art, it still shows technical problems connected with the threshold values of the gate voltage, with the current density that may be injected into the semiconductor structure and with the brightness. The technical characteristics of the known structure are incompatible with the majority of commercial applications. These limitations are overcome by the present invention.

At present, there is therefore the need to develop organic transistors with improved electroluminescence features, in particular capable of more effectively accumulating and better balancing of electric charge, of higher brightness and efficiency.

It is therefore an objective of the present invention to provide an improved electroluminescent organic transistor with respect to the prior art. Said objective is achieved with an electroluminescent organic transistor whose main features are disclosed in the first claim, while other features are disclosed in the remaining claims.

A first advantage of the electroluminescent organic transistor according to the present invention consists in that it allows the achievement of a reduction of the voltage threshold applied to the control electrode (known by the term "gate"), due to a more effective accumulation of charge and to a consequent higher charge density due to the presence of a plurality of semiconductor structures. In particular, the accumulation of a first type of charge in the multilayer structure facilitates the injection and accumulation in the multilayer structure of the second type of charge, thus improving the obtainable charge density and balancing, with respect to a structure, for example with only three layers wherein the same voltages are applied. The electroluminescent organic transistor according to the present invention actually allows also an increase of current flow proportional to the number of the used semiconductor structures, a maximization of the emitted light intensity due both to the greater charge density and its best balance, and to the increase of the number of emitting layers r and hence of the emitting material volume.

The electroluminescent organic transistor according to the present invention is also characterized by an excellent electric charge balance among the various layers.

Surprisingly, it has been found that the presence of a multiplicity of semiconductor structures, connected to a single couple of source and drain electrodes, does not influence in a negative way the transverse electric field due to an increase in the incidence of interface phenomena. In contrast and unexpectedly, it was found out that the functionality of the transistor according to the present invention can be maintained through a suitable choice of the number of semiconductor layers and of the materials forming said layers, without using multiple electrodes periodically positioned in the semiconductor structure, but by positioning said electrodes exclusively in contact either with the first or with the last layer of said plurality of semiconductor structures, or alternatively in contact with both of said first and last layer, thus also obtaining the above mentioned advantages concerning the charge accumulation and balancing and current flow increase. From the structural point of view, this is made possible because, compared to the prior art, the device according to the invention has a semiconductor structure characterized by the presence of repeated r emitting-type layers, each of which is placed in contact with at least one p-type semiconductor material layer and at least one n-type semiconductor material layer.

The semiconductor structure of the electroluminescent organic transistor according to the present invention may comprise, for example, from five to eleven semiconductor layers as defined above, of which at least two of emitting semiconductor layers r and at least three semiconductor layers, which are n-type or p-type. Preferably, said semiconductor structure comprises 5 semiconductor layers.

Further advantages and features of the device according to the present invention will become apparent to those skilled in the art from the following detailed and non-limiting description of an embodiment thereof with reference to the accompanying drawings in which.

Figure 1:
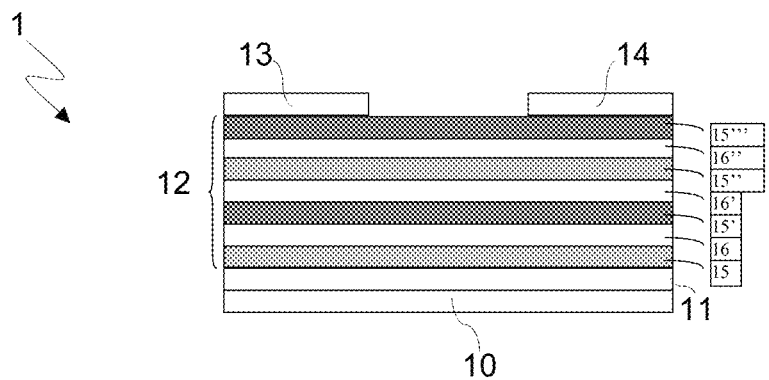
FIG. 1 shows a schematic sectional view of an electroluminescent organic transistor according to the most general embodiment of the present invention.

With reference to FIG. 1, it is shown that the electroluminescent organic transistor 1 according to the present invention comprises at least one control electrode 10 on which a first layer of dielectric material 11 is deposited.

The transistor further comprises a semiconductor structure 12 and a couple of electrodes consisting of a source electrode 13 suitable for the injection in said semiconductor structure of charges of a first type, for example electrons, and a drain electrode 14 suitable for the injection in said semiconductor structure of charges of a second type, for example holes.

Said first layer of dielectric material 11 is positioned between the control electrode 10 and said semiconductor structure 12, that is, according to a transistor structure known in the field with the expression "bottom gate/top contact".

According to the invention, the semiconductor structure 12 of the electroluminescent organic transistor 1 comprises at least one p-type semiconductor material layer, at least one n-type semiconductor material layer and at least two layers of emitting material, wherein each layer of emitting material is positioned in direct contact with a p-type semiconductor material layer and with an n-type semiconductor material layer.

The semiconductor structure therefore comprises a plurality of layers of semiconductor material indicated in the figure by reference numbers 15', 15", 15'", . . . , each of said layers is formed of a p-type semiconductor material or an n-type semiconductor material. In addition, there are at least two r emitting semiconductor layers 16, 16', . . . separated by at least one n-type or p-type semiconductor layer 15', 15", 15'", . . .

In the present description and claims, the term "p-type semiconductor material" is intended to mean a semiconductor material having a value of mobility of p-type charge carriers of at least $10^{-6}$ cm$^2$/Vs, measured in conditions of field effect transport. Preferably, this value of mobility of p-type charge carriers is at least $10^{-1}$ cm$^2$/Vs, measured in conditions of field effect transport.

The term "n-type semiconductor material", is intended to mean a semiconductor material having a value of n-type charge carriers mobility of at least $10^{-6}$ cm$^2$/Vs, measured in conditions of field effect transport. Preferably, this value of n-type charge carriers mobility is at least $10^{-1}$ cm$^2$/Vs, measured in conditions of field effect transport.

The semiconductor structure 12 of the electroluminescent organic transistor according to the present invention comprises N layers of semiconductor material as above defined, of which at least two layers r of emitting semiconductor, each of which is in contact with two layers of semiconductor material, one of p-type and the other of n-type.

The p-type semiconductor material contained in the semiconductor structures is preferably formed of oligoacenes, oligothiophenes, oligofluorenes, pyrimidine derivatives of oligothiophenes, substituted tetrathiophenes at the α- and ω-positions with alkyl chains, diimide derivatives of oligothiophenes, pyrimidine derivatives of oligothiophenes, oligothiophenes with thiazole core. Said p-type semiconductor material layers preferably have a thickness between 5 and 20 nm.

The n-type semiconductor material contained in the structures is preferably formed of diimide derivatives of perylenes, oligothiophenes with thiazole core, coronene derivatives and derivatives of tetrathiophene substituted in positions α- and ω-with perfluorinated chains. Said n-type semiconductor material layers preferably have a thickness between 5 and 20 nm.

The r emitting semiconductor material forming layers 16, 16', . . . contained in the semiconductor structure is an emitting material or a combination of emitting materials, optionally of host-guest type, such as a matrix of aluminum quinoline that may doped with, for example, 4-(dicyanomethylene)-2-methyl-6-(p-dimethylaminostyryl)-4H-pyrane, platinum octaethyl-porphyrins, acetylacetonate iridium phenylisochinoline.

These r emitting semiconductor layers preferably have a thickness between 10 and 40 nm.

As material for said source electrode 13, indium tin oxide (ITO), gold, copper, silver, aluminum, calcium, magnesium, chromium, iron and poly (3,4-ethylenedioxythiophene) combined with poly (styrenesulfonate) (PEDOT: PSS) can be used. Preferably, aluminum, calcium, magnesium, or gold is used.

As material for said drain electrode 14 indium tin oxide (ITO), gold, copper, silver, aluminum, calcium, magnesium, chromium, iron and poly (3,4-ethylenedioxythiophene) combined with poly (styrenesulfonate) (PEDOT: PSS) can be used. Preferably, gold or indium tin oxide (ITO) is used.

According to an advantageous embodiment of the invention, said source electrode 13 and said drain electrode 14 are both in contact with the same layer of semiconductor material, that is, preferably they are in contact with the layer of semiconductor material that is the furthest from said first layer of dielectric material, with respect to the layers of semiconductor materials of said semiconductor structure. In other words, the semiconductor structure is positioned between said first layer of dielectric material and said source and drain electrodes.

The source and drain electrodes 13 and 14 may be positioned on a substantially flat surface of the semiconductor material layer with which they are in contact, or each electrode is positioned in a suitable recess of the semiconductor material layer.

In other embodiments of the invention such electrodes may be embedded within the semiconductor material, or may have the same thickness of this layer of semiconductor material with which they are in contact and be "capping" the sides of said layer.

Preferably, in the electroluminescent organic transistor according to the present invention, said source electrode 13 and said drain electrode 14 are coplanar with a semiconductor material layer, or said electrodes 13 and 14 both lie on a plane parallel to a plane on which said layer of semiconductor material lies.

The electroluminescent organic transistor 1 according to the invention may further comprise a second layer of dielectric material and a second control electrode, disposed on the opposite side of the semiconductor structure 12 with respect to the first layer of dielectric material. In this way, the semiconductor structure is disposed between said first layer of dielectric material 11 and said second layer of dielectric material. The second control electrode is disposed on top of, i.e. in contact with, said second layer of dielectric material. The materials of the first dielectric layer 11 and of the possible second dielectric layer may be selected among the conventional dielectric materials for electroluminescent organic transistors. In particular, silicon dioxide, polymethylmethacrylate (PMMA), zinc oxide, alumina, zirconium oxide, hafnium dioxide, fluoropolymers, such as for example the commercial product Cytop™ polyvinyl alcohol (PVA), polystyrene (PS) and self-assembled nanostructures of zirconium and organic molecules (Zr-SAND: Zirconium Self Assembled Nano Dielectrics) may be used. Preferably, said first dielectric layer 11 comprises two layers of zirconium oxide and polymethylmethacrylate and said second dielectric layer is made of polymethylmethacrylate or Cytop™.

The material of the control electrode 10 and of the possible second control electrode may be selected from indium tin oxide (ITO), gold, copper, silver, aluminum. Preferably, indium tin oxide and/or gold may be used.

Figure 2:
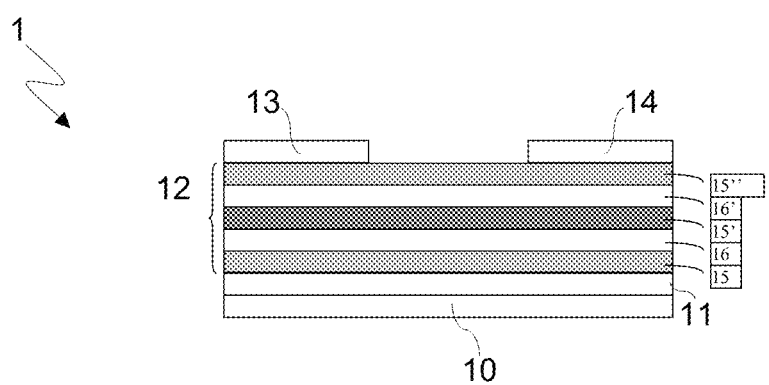
FIG. 2 shows a sectional schematic view of an electroluminescent organic transistor according to a first embodiment of the present invention.

With reference to FIG. 2, in a possible embodiment of the present invention a semiconductor structure 12 is used, in which there are two r emitting semiconductor layers 16 and 16'. The emitting semiconductor layer 16 is positioned over the layer of p-type semiconductor material 15 that is deposited over the dielectric layer 11 in contact with the control electrode 10. Said layer of emitting semiconductor material 16 is covered with a layer of n-type semiconductor material 15' which is covered by a second layer r of emitting semiconductor material 16'. The semiconductor structure 12 is then completed by the layer of p-type semiconductor material 15'' on the surface of which the source electrodes 13 and drain 14 are positioned. The architecture of this semiconductor structure having 5 layers can thus be described as of the type p-r-n-r-p based on the order with which the various layers of materials of different types (p, n or r) are deposited on each other.

Figure 3:
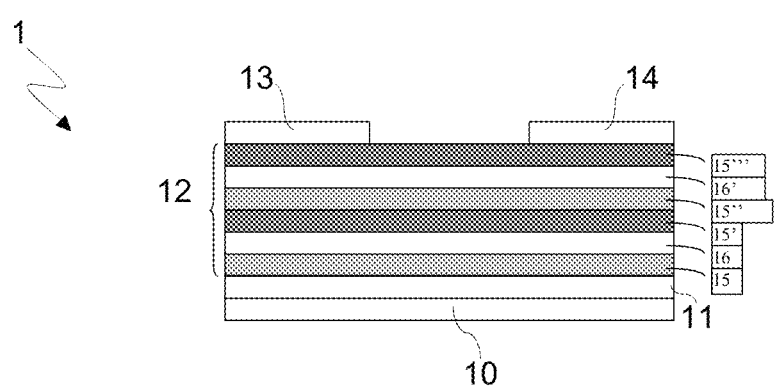
FIG. 3 shows a schematic sectional view of an electroluminescent organic transistor according to a second embodiment of the present invention The features of the drawings are not to scale, but their dimensions are enlarged or reduced in order to increase the clarity of the drawings.

The above described architecture presented in FIG. 2 is not the only mode of embodiment that allows the presence of two layers r of emitting semiconductor material. By way of example, in FIG. 3 a p-r-n-p-r-n type architecture is shown. Differently from the structure described for the semiconductor structure p-r-n-r-p of FIG. 2, here the n-type semiconductor material layer 15' is covered with a p-type semiconductor material layer 15'' which is covered by the second layer r of emitting semiconductor material 16'. The semiconductor structure 12 is then completed by an n-type semiconductor material layer 15''' on which the source electrodes 13 and drain 14 are positioned.

In a further embodiment thereof, the electroluminescent organic transistor may further comprise a second source electrode suitable for injection of charges of a first type in said semiconductor structure and a second drain electrode suitable for injection of charges of a second type in said semiconductor structure, characterized in that said second source electrode and said second drain electrode are in contact with the layer of semiconductor material which is the furthest from the semiconductor layer that is in contact with said first source electrode and said first drain electrode. From the practical point of view this embodiment results in the presence of a second gate electrode (G2) in contact with the second dielectric layer and an additional couple of source (S2) and drain (D2) electrodes in correspondence of the first layer forming the semiconductor multilayer structure, while in correspondence with the last layer of the semiconductor structure is present the couple of source (S1) and drain (D1) electrodes equivalent to that shown in FIGS. 2 and 3.

Possible modifications and/or additions may be made by those skilled in the art to the hereinabove disclosed and illustrated embodiment while remaining within the scope of the following claims.

The invention claimed is:

1. An electroluminescent organic transistor, comprising:
at least one control electrode;
a semiconductive structure;
at least one first layer of dielectric material positioned between said at least one control electrode and said semiconductive structure;
at least one source electrode suitable for injecting charges of a first type in said semiconductive structure; and
at least one drain electrode suitable for injecting charges of a second type in said semiconductive structure, wherein said semiconductive structure comprises at least one layer of p-type semiconductor material, at least one layer of n-type semiconductor material and at least two layers of emitting material, wherein each layer of the at least two layers of emitting material directly contacts one layer of the at least one layer of p-type semiconductor material and one layer of the at least one layer of n-type semiconductor material.

2. The electroluminescent organic transistor according to claim 1, wherein said at least one source electrode and said at least one drain electrode both contact a same layer of semiconductor material.

3. The electroluminescent organic transistor according to claim 2, wherein said at least one source electrode and said at least one drain electrode both contact a layer of semiconductor material that is furthest from a layer of semiconductor material which is in contact with said at least one first layer of dielectric material.

4. The electroluminescent organic transistor according to claim 2, wherein said semiconductive structure is positioned between said at least one first layer of dielectric material and said at least one source electrode and said at least one drain electrode.

5. The electroluminescent organic transistor according to claim 1 further comprising a second layer of dielectric material, wherein said semiconductive structure is positioned between said at least one first layer of dielectric material and said second layer of dielectric material.

6. The electroluminescent organic transistor according to claim 5, further comprising a second control electrode in contact with said second layer of dielectric material, a second source electrode suitable for injecting charges of a first type in said semiconductive structure and a second drain electrode suitable for injecting charges of a second type in said semiconductive structure; said second source electrode and said second drain electrode contacting a layer of semiconductor material which is furthest from a layer of semiconductor material with which said first source electrode and said first drain electrode are in contact.

7. The electroluminescent organic transistor according to claim 1, wherein the electroluminescent organic transistor comprises five to eleven layers of semiconductor material.

* * * * *